US009641174B2

(12) United States Patent
Bachman et al.

(10) Patent No.: US 9,641,174 B2
(45) Date of Patent: May 2, 2017

(54) USE OF MICRO-STRUCTURED PLATE FOR CONTROLLING CAPACITANCE OF MECHANICAL CAPACITOR SWITCHES

(75) Inventors: Mark Bachman, Irvine, CA (US); Guann-Pyng Li, Irvine, CA (US); Yang Zhang, Irvine, CA (US); Ruisheng Chang, Irvine, CA (US); Minfeng Wang, Irvine, CA (US); Sungjun Kim, Irvine, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 13/444,753

(22) Filed: Apr. 11, 2012

(65) Prior Publication Data
US 2012/0279845 A1    Nov. 8, 2012

Related U.S. Application Data

(60) Provisional application No. 61/473,976, filed on Apr. 11, 2011.

(51) Int. Cl.
*H01H 51/22*    (2006.01)
*H03K 17/975*    (2006.01)

(52) U.S. Cl.
CPC .................. *H03K 17/975* (2013.01)

(58) Field of Classification Search
CPC ............ H03K 17/962; H03K 17/9622; H03K 17/975; H01H 2239/006
USPC ........................................................... 335/78
See application file for complete search history.

(56) References Cited

U.S. PATENT DOCUMENTS

| 6,100,477 | A  | * | 8/2000 | Randall et al. ............. 200/181 |
| 6,608,268 | B1 | * | 8/2003 | Goldsmith .................. 200/181 |
| 6,621,387 | B1 | * | 9/2003 | Hopcroft ..................... 333/262 |
| 6,717,496 | B2 | * | 4/2004 | Feng et al. ..................... 335/78 |
| 6,777,765 | B2 | * | 8/2004 | Chen et al. .................. 257/415 |
| 6,919,784 | B2 | * | 7/2005 | Feng et al. ..................... 335/78 |
| 6,960,971 | B2 | * | 11/2005 | Park et al. ................... 333/262 |
| 6,985,058 | B2 | * | 1/2006 | D'Amico et al. ............. 335/78 |
| 7,015,780 | B2 | * | 3/2006 | Bernstein et al. ........... 335/302 |
| 7,126,495 | B2 | * | 10/2006 | Netzer ................. G01D 11/245 324/658 |
| 7,142,076 | B2 | * | 11/2006 | Feng et al. ..................... 335/78 |
| 7,256,670 | B2 | * | 8/2007 | Jahnes et al. .................. 335/78 |
| 7,381,583 | B1 | * | 6/2008 | Ebel et al. ..................... 438/53 |
| 7,834,722 | B2 | * | 11/2010 | Millet ............................ 335/78 |
| 7,858,423 | B2 | * | 12/2010 | Siamak ............... B81C 1/00246 257/E21.011 |
| 8,115,577 | B2 | * | 2/2012 | Nakatsuka et al. ............ 335/78 |

(Continued)

*Primary Examiner* — Shawki S Ismail
*Assistant Examiner* — Lisa Homza
(74) *Attorney, Agent, or Firm* — One LLP

(57) ABSTRACT

Micro capacitive switches and methods of manufacturing micro capacitive switches at variable nominal capacitance value using micro-structures on the contact plates of the same dimension. In a preferred embodiment, a separately manufactured contact plate can be mounted to a movable magnet in order to be actuated to "on" and "off" state of the capacitive switch. Depending on the contact plate's surface condition, variable contact capacitance at "on" state can be precisely specified by geometrical properties of the micro-structures on the surface, such as the density, size and depth.

17 Claims, 4 Drawing Sheets

(56) References Cited

U.S. PATENT DOCUMENTS

| | | | |
|---|---|---|---|
| 8,203,402 B2* | 6/2012 | Steeneken et al. | 335/78 |
| 2003/0146079 A1* | 8/2003 | Goldsmith | H01P 1/127 |
| | | | 200/181 |
| 2004/0113727 A1* | 6/2004 | Kawai | 335/78 |
| 2006/0091983 A1* | 5/2006 | Robert | 335/78 |
| 2007/0256917 A1* | 11/2007 | Oberhammer et al. | 200/181 |
| 2008/0297980 A1* | 12/2008 | Bourcier | C02F 1/46109 |
| | | | 361/502 |
| 2009/0050356 A1* | 2/2009 | Hsu | H05K 1/162 |
| | | | 174/260 |
| 2009/0211885 A1* | 8/2009 | Steeneken et al. | 200/181 |
| 2009/0296307 A1* | 12/2009 | Siamak | B81C 1/00246 |
| | | | 361/281 |
| 2012/0073940 A1* | 3/2012 | Masunishi et al. | 200/181 |
| 2012/0103768 A1* | 5/2012 | Bachman et al. | 200/181 |

* cited by examiner

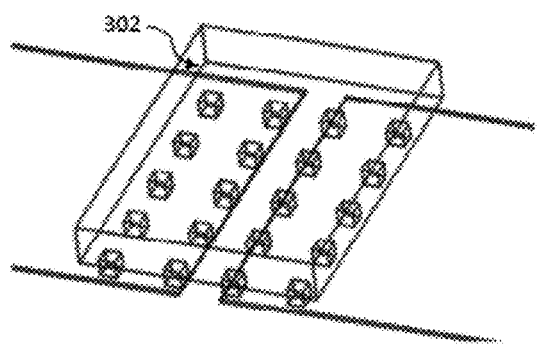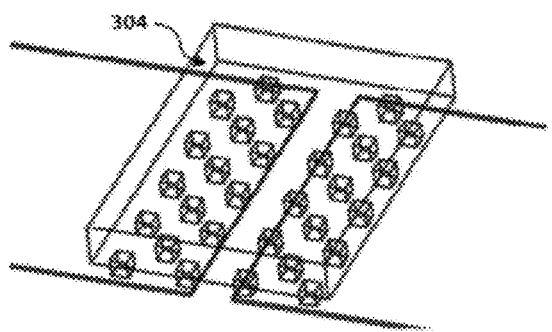
FIGURE 3A    FIGURE 3B

FIGURE 4A    FIGURE 4B

USE OF MICRO-STRUCTURED PLATE FOR CONTROLLING CAPACITANCE OF MECHANICAL CAPACITOR SWITCHES

CROSS-REFERENCE TO RELATED APPLICATIONS

This application claims the benefit of U.S. Provisional Application No. 61/473,976, filed Apr. 11, 2011, which application is incorporated herein by reference.

FIELD

The embodiments described herein are generally related to capacitive switches and, more particularly, to capacitive micro switches and methods to design capacitive micro switches using contact micro structures to control capacitance level.

BACKGROUND INFORMATION

To fabricate traditional micro-electro-mechanical capacitance switches for lower power (less than 1 W) radio frequency applications, the area and the thickness of the dielectric film in the Metal-Insulator-Metal (MIM) configuration are varied to control the capacitance values. Changing the dielectric thickness apparently has benefit in manufacturing uniformity. However, in applications with radio frequency power much higher than 1 W, the dielectric material has strict thickness requirements in order to prevent breakdown failure during switching and the "on" state. Another option is to vary the area of both contact plates. For high capacitance values, it is difficult to maintain a homogeneous contact with relatively large contact surface area (over 10 mm$^2$) during mass production. For low to medium capacitance, variable surface areas require manufacturing of contact plates at assorted sizes, which brings extra design and fabrication constraints for high power radio frequency applications.

SUMMARY

The embodiments provided herein introduce methods of design and manufacture of micro structures for micro capacitive switches of different capacitance with the same plate size for high power application. The embodiments also provide micro-structured plates for precision capacitance control of micro mechanical capacitive switches. The capacitance value can be changed by varying the number and the contact structures, such as micro posts and micro periodic structures.

Micro-structures patterned on a rigid plate can easily manipulate the resulting capacitance across a large range, which is a unique feature for mass production of capacitor switches at different nominal capacitance. Continuous, periodic micro-structures can significantly increase the maximum capacitance value within limited real estate on the contact plates. Discrete micro posts with variable geometries can prevent unwanted coupling and aid heat dissipation during high power operation.

Micro structures of different cross-sectional shapes can be fabricated uniformly above the contact surfaces of both capacitor plates. The geometric properties, including but not limited to, height, cross-section and gap, of the micro structures are varied to adjust capacitance value and optimize capacitor switch performance for low to high radio frequency electric power. The overall contact area of the micro structures determines the capacitance at the contact of both plates.

The embodiments provided herein have utility in the area of the telecommunication, radar and satellite systems, such as phase shifters, diversity antennas, resonators, line switches, attenuators, isolators, and tuning circuits. On average, tens to hundreds of capacitive switches are needed to accomplish programmable radio frequency circuits. Micro switches with uniform footprint are best suitable for integration on radio frequency boards. These embodiments are also applicable to radio frequency phase shifters, antenna switches and power amplifiers that are critical components for the telecommunication industry.

Other systems, methods, features and advantages of the invention will be or will become apparent to one with skill in the art upon examination of the following figures and detailed description.

DESCRIPTION OF THE DRAWINGS

The details of the invention, including fabrication, structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

FIGS. 3A and 3B are perspective views illustrating different configurations of micro posts to control capacitance values.

FIGS. 4A and 4B are plan views illustrating different embodiments of a fabrication process to deposit dielectric material on micro posts.

DESCRIPTION OF EMBODIMENTS

The embodiments provided herein are directed to micro capacitive switches and a method of manufacturing micro capacitive switches at variable nominal capacitance value using micro-structures on the contact plates of the same dimension. Micro-structures patterned on a rigid plate can easily manipulate the resulting capacitance across a large range, which is a unique feature for mass production of capacitor switches at different nominal capacitance. Continuous, periodic micro-structures can significantly increase the maximum capacitance value within limited real estate on the contact plates. Discrete micro posts with variable geometries can prevent unwanted coupling and aid heat dissipation during high power operation.

Micro structures of different cross-sectional shapes can be fabricated uniformly above the contact surfaces of both capacitor plates. The geometric properties, including but not limited to, height, cross-section and gap, of the micro structures are varied to adjust capacitance value and optimize capacitor switch performance for low to high radio frequency electric power. The overall contact area of the micro structures determines the capacitance at contact of both plates.

In the preferred embodiment, a separately manufactured contact plate can be mounted to a movable magnet in order to be actuated to an "on" and an "off" state of the capacitive switch. Depending on the contact plate's surface condition, variable contact capacitance at the "on" state can be precisely specified by geometrical properties of the micro-structures on the surface, such as the density, size and depth.

Figures 1A, 1B:
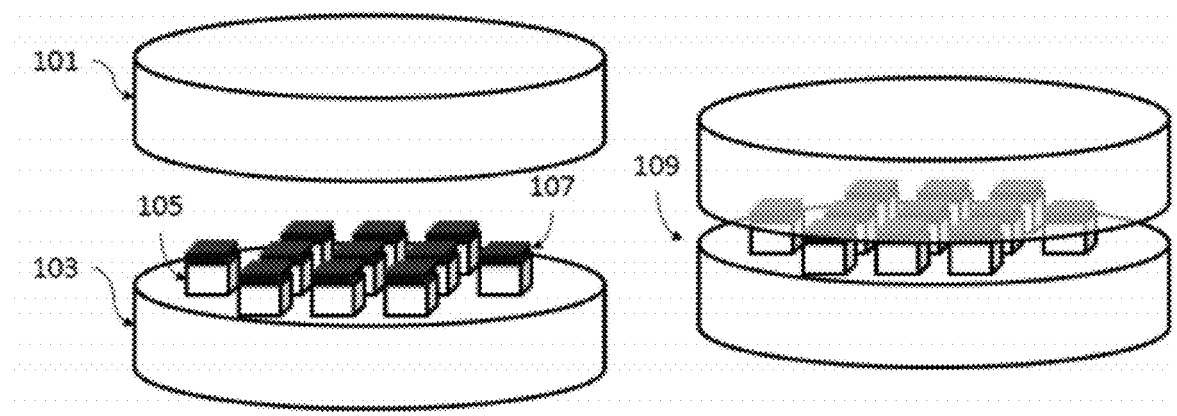
FIGS. 1A and 1B are perspective views of one embodiment of a capacitor switch with micro structures-micro posts.

Turning in detail to the figures, FIGS. 1A and 1B show a capacitor switch with one type of micro structures-micro posts. The top plate (101) makes contact with the bottom plate (103) where cubical micro posts (105) are patterned. Dielectric coating (107), such as silicon nitride, is deposited on the micro posts for a capacitive contact during the "on" state (109).

Figure 2:
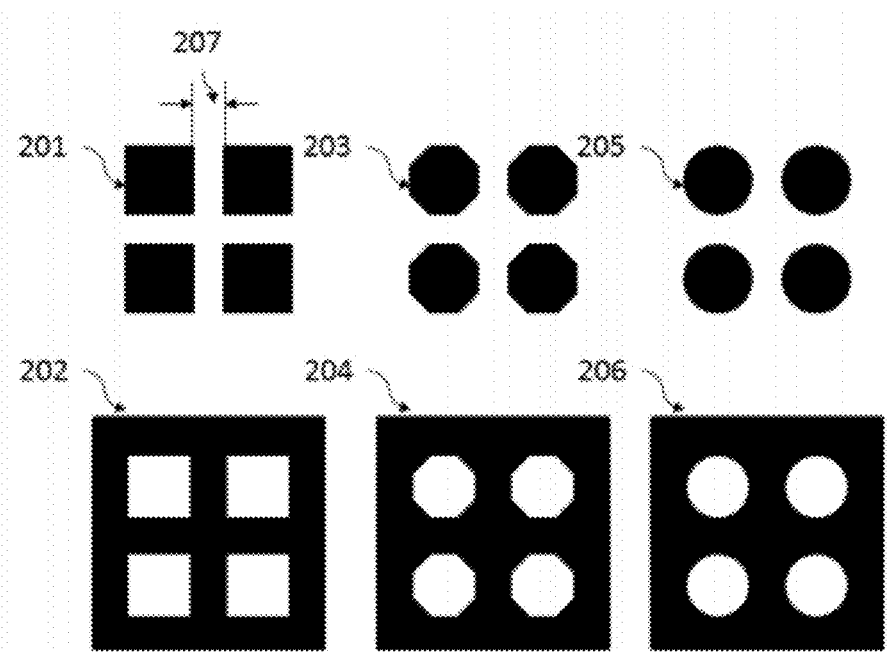
FIG. 2 includes multiple top views showing different shapes of micro posts for a micro-structure.

FIG. 2 is the top view of the different shapes of micro posts, as a typical micro-structure. A plurality of topologies can be designed to fill a pre-defined area, such as rectangular (201), octagonal (203), and circular (205). The gap (207) between micro structures helps fill the area and provide sufficient buffer space to prevent stray coupling. The inversed configuration where micro wells with a plurality of shapes can also be used to fill the plate contact, such as rectangular (202), octagonal (204), and circular (206).

FIGS. 3A and 3B illustrate different configurations of micro posts to control capacitance values. Alternating patterns provide further adjustment of overall occupancy of the plate area, and thus the corresponding capacitance. A scarce configuration (302) of micro structures is compared with a dense configuration (304) of micro structures.

FIGS. 4A and 4B illustrate different fabrication processes (402) and (404) to deposit dielectric material on micro posts. The dielectric deposition process (408) can be applied before (402) or after (404) the process (406) of forming micro structures on the capacitor plates.

Figure 5:
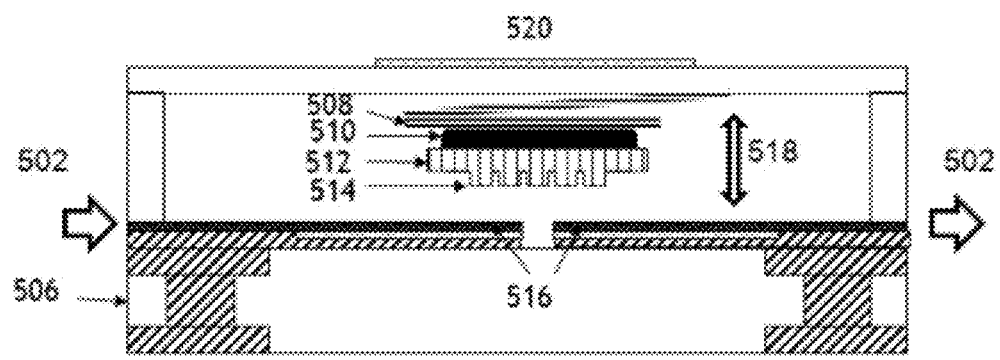
FIG. 5 is a plan view illustrating an example embodiment of micro-structured plates.

FIG. 5 is an example implementation of micro-structured plates. The micro structure includes a NI latching layer (520). Micro posts (514) reside on a top plate (512) comprising a silicon header. The top plate (512) is coupled to a magnet (510) and a bridge (508). The top plate (512) travels through a stroke (518) and the micro posts (514) make contact with two parallel bottom plates (516) on a substrate (506). The radio frequency power (502) is transmitted between the top (512) and bottom plates (516) through micro structures (514) when in "on" state. The top plate (512) can be manufactured separately to the other structures.

Figure 6A:
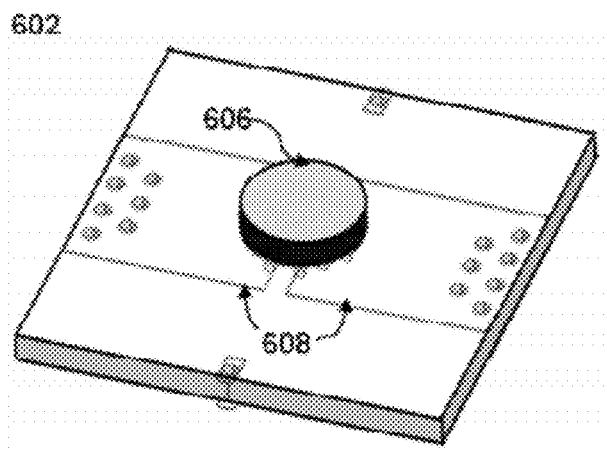
FIGS. 6A and 6B are perspective view of a preferred embodiment of capacitor devices with micro-structured plates.
Figure 6B:
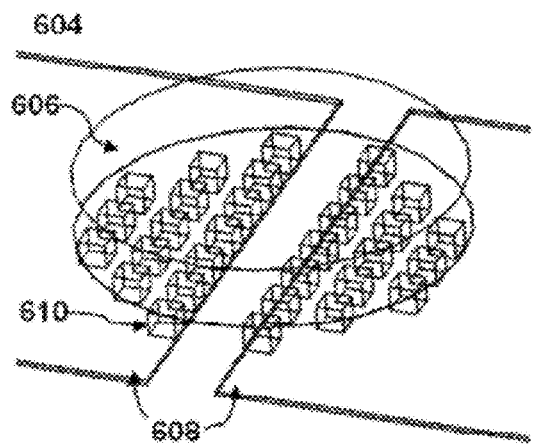
Figure 7A:
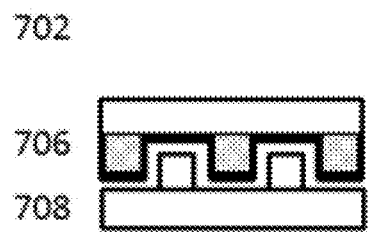
FIGS. 7A, 7B, 7C and 7D are plan views illustrating example embodiments using periodic structures between two plates to increase capacitance through increased effective contact area.
Figure 7B:
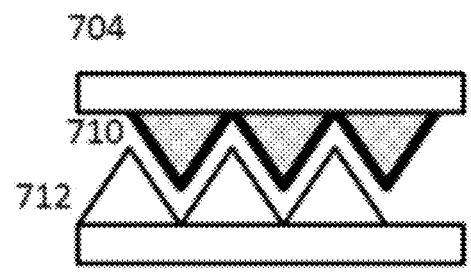
Figure 7C:
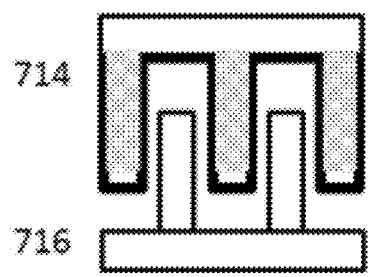
Figure 7D:
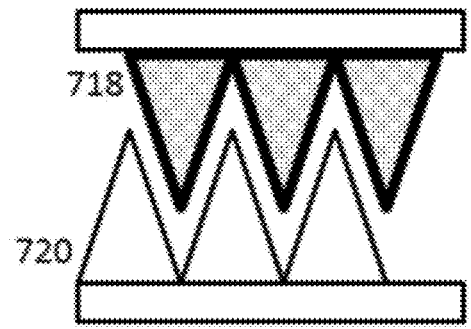

FIGS. 6A and 6B is a preferred embodiment of capacitor devices (602) and (604) with micro-structured plates (608). A movable magnet (606) is brought to contact with two parallel plates (608), where micro posts (610) are patterned. The contact surface of the magnet (606) is coated with a variable thickness of gold in order to transmit radio frequency power.

FIGS. 7A, 7B, 7C and 7D shows example implementations using periodic structures between two plates to increase capacitance through increasing or creating effective contact area. Designs with discrete micro posts (702) and with periodic structures (704) are shown as examples to increase contact capacitance for micro capacitive switches. Micro-structures, such as posts (706, 708) and saw tooth (710, 712), can be designed with extended aspect ratio to further increase capacitance (714, 716, 718, 720).

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions described herein is merely illustrative, unless otherwise stated, and the invention can be performed using different or additional process actions or a different combination or ordering of process actions. As another example, each feature of one embodiment can be mixed and matched with other features shown in other embodiments. Features and processes known to those of ordinary skill may similarly be incorporated as desired. Additionally and obviously, features may be added or subtracted as desired. Accordingly, the invention is not to be restricted except in light of the attached claims and their equivalents.

What is claimed is:

1. A capacitance switch comprising
a first plate including a magnet,
a second plate, and
a plurality of micro-posts extending from the first plate and having uniform dimensions,
the plurality of micro-posts having a dielectric coating deposited thereon,
wherein during an "off" state the plurality of micro-posts are in spaced relation with the second plate, and
wherein radio frequency power is transmitted between the first and second plates through the plurality of micro-posts when in an "on state", and wherein during the "on" state the plurality of micro-posts contact the second plate creating a homogeneous capacitive contact with the second plate across the plurality of micro-posts and capacitively coupling the first plate with the second plate,
wherein a capacitive value of the homogeneous capacitive contact is a function of the number of individual micro-posts in contact with the second plate.

2. The capacitance switch of claim 1 wherein the dielectric is silicon nitride.

3. The capacitance switch of claim 1 wherein the plurality of micro-posts have a rectangular shape.

4. The capacitance switch of claim 1 wherein the plurality of micro-posts have a circular shape.

5. The capacitance switch of claim 1 wherein the plurality of micro-posts have an octagonal shape.

6. The capacitance switch of claim 1 wherein the capacitive value of the homogeneous capacitive contact is a function of a contact area between the plurality of micro-posts and the second plate.

7. The capacitance switch of claim 1 wherein the capacitive value of the homogeneous capacitive contact is a function of the height of a micro-post of the plurality of micro-posts.

8. A capacitance switch comprising
a first plate including a magnet,
a second plate, and
a plurality of micro-posts extending from the first plate and having uniform dimensions, the plurality of micro-posts having a dielectric coating deposited thereon, wherein during an "off" state the plurality of micro-posts are in spaced relation with the second plate, and wherein radio frequency power is transmitted between the first and second plates through the plurality of micro-posts when in an "on state", and wherein during the and during an "on" state the plurality of micro-posts contact the second plate creating a homogeneous capacitive contact with the second plate across the plurality of micro-posts and capacitively coupling the first plate with the second plate, wherein a capacitive value of the homogeneous capacitive contact is a function of a periodic pattern of the plurality of micro-posts.

9. A micro-post capacitance switch comprising
a top plate including a magnet,
a plurality of micro-posts coupled to the top plate and having uniform dimensions, the plurality of micro-posts having a dielectric coating deposited thereon, and
a pair of parallel bottom plates, the bottom plates being laterally spaced from one another,
wherein radio frequency power is transmitted between the top and bottom plates through the plurality of micro-posts when in an "on" state, wherein the plurality of micro-posts capacitively and homogeneously couple the top and bottom plates in the "on" state, wherein during an "off" state the plurality of micro-posts are in spaced relation with the bottom plates.

10. The micro-post circuit of claim 9 wherein the dielectric is silicon nitride.

11. The micro-post circuit of claim 9 wherein the capacitance of the homogeneous capacitive coupling has a value that is a function of the number of individual micro-posts in contact with the bottom plates.

12. The micro-post circuit of claim 9 wherein the plurality of micro-posts have a rectangular shape.

13. The micro-post circuit of claim 9 wherein the plurality of micro-posts have a circular shape.

14. The micro-post circuit of claim 9 wherein the plurality of micro-posts have an octagonal shape.

15. The micro-post circuit of claim 9 wherein the capacitance of the homogeneous capacitive coupling has a value that is a function of a contact area between the plurality of micro-posts and the second plate.

16. The micro-post circuit of claim 9 wherein the capacitance of the capacitive coupling has a value that is a function of the height of a micro-post of the plurality of micro-posts.

17. A micro-post capacitance switch comprising
a top plate including a magnet,
a plurality of micro-posts coupled to the top plate and having uniform dimensions, the plurality of micro-posts having a dielectric coating deposited thereon, and
a pair of parallel bottom plates, the bottom plates being laterally spaced from one another,
wherein radio frequency power is transmitted between the top and bottom plates through the plurality of micro-posts when in an "on" state, wherein the plurality of micro-posts capacitively and homogeneously couple the top and bottom plates in the "on" state, wherein during an "off" state the plurality of micro-posts are in spaced relation with the bottom plates, and wherein the capacitance of the capacitive coupling has a value that is a function of a periodic pattern of the plurality of micro-posts.

* * * * *